(12) United States Patent
Lee et al.

(10) Patent No.: US 10,749,136 B2
(45) Date of Patent: Aug. 18, 2020

(54) DISPLAY DEVICE

(71) Applicant: SAMSUNG DISPLAY CO., LTD., Yongin-si, Gyeonggi-do (KR)

(72) Inventors: Taehee Lee, Hwaseong-si (KR); Wonki Hong, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/143,958

(22) Filed: Sep. 27, 2018

(65) Prior Publication Data

US 2019/0273217 A1 Sep. 5, 2019

(30) Foreign Application Priority Data

Mar. 5, 2018 (KR) ........................ 10-2018-0025616

(51) Int. Cl.
  *G06F 1/16* (2006.01)
  *H01L 51/52* (2006.01)
  *G06F 3/041* (2006.01)
  *H01L 51/00* (2006.01)

(52) U.S. Cl.
  CPC ........ *H01L 51/5237* (2013.01); *G06F 3/0412* (2013.01); *G06F 3/0414* (2013.01); *H01L 51/0097* (2013.01); *G06F 1/16* (2013.01)

(58) Field of Classification Search
  None
  See application file for complete search history.

(56) References Cited

U.S. PATENT DOCUMENTS

| | | | | |
|---|---|---|---|---|
| 9,146,590 B2 * | 9/2015 | Myers | ............... | G06F 1/1633 |
| 9,189,016 B2 * | 11/2015 | Jang | ............... | G06F 1/1652 |
| 9,274,660 B2 | 3/2016 | Bernstein et al. | | |
| 9,323,292 B2 * | 4/2016 | Bae | ............... | G06F 1/1656 |
| 9,450,038 B2 * | 9/2016 | Kwon | ............... | H01L 27/3276 |
| 2009/0257207 A1 * | 10/2009 | Wang | ............... | G06F 1/1626 361/752 |
| 2012/0314383 A1 * | 12/2012 | Oohira | ............... | G02F 1/13452 361/749 |
| 2013/0002133 A1 * | 1/2013 | Jin | ............... | H01L 51/524 313/511 |

(Continued)

FOREIGN PATENT DOCUMENTS

| | | |
|---|---|---|
| JP | 6087394 | 2/2017 |
| KR | 10-1560389 | 10/2015 |
| KR | 10-2016-0149982 | 12/2016 |

*Primary Examiner* — Courtney L Smith
*Assistant Examiner* — Rashen E Morrison
(74) *Attorney, Agent, or Firm* — F. Chau & Associates, LLC

(57) ABSTRACT

A display device includes: a frame that includes a plurality of protrusions; a display panel disposed on the frame that includes a planar portion and a curved portion; a pressure sensing unit disposed between the frame and the display panel that overlaps the curved portion and that includes a plurality of first electrodes and a plurality of second electrodes disposed in a different layer; and a pressure sensing drive unit connected to the plurality of first electrodes and the plurality of second electrodes. Any one of the plurality of second electrodes at least partially overlaps any one of the plurality of first electrodes. At least one of the plurality of protrusions overlaps a region where one of the plurality of first electrodes and one of the plurality of second electrodes overlap each other.

25 Claims, 20 Drawing Sheets

(56) References Cited

U.S. PATENT DOCUMENTS

| | | | |
|---|---|---|---|
| 2014/0085213 A1 | 3/2014 | Huppi et al. | |
| 2014/0132488 A1* | 5/2014 | Kim | G06F 1/1652 345/76 |
| 2014/0168090 A1* | 6/2014 | Aaltonen | G06F 1/1601 345/173 |
| 2014/0320762 A1* | 10/2014 | Jeong | G06F 3/041 349/12 |
| 2015/0331451 A1* | 11/2015 | Shin | H04M 1/0283 345/173 |
| 2016/0299527 A1* | 10/2016 | Kwak | H04M 1/0266 |

* cited by examiner

DISPLAY DEVICE

CROSS-REFERENCE TO RELATED APPLICATION

This application claims priority under 35 U.S.C. § 119 from, and the benefit of, Korean Patent Application No. 10-2018-0025616, filed on Mar. 5, 2018 in the Korean Intellectual Property Office (KIPO), the contents of which are herein incorporated by reference in their entirety.

1. Technical Field

Embodiments of the present disclosure are directed to a display device, and more specifically to a display device that includes a pressure sensing unit.

2. Discussion of Related Art

With the development of the information society, the demand for display devices configured to display images in various forms has increased. For example, various types of display devices are being utilized, such as liquid crystal display devices, plasma display devices, and organic light emitting display devices.

Of these display devices, mobile display devices, such as smartphones, tablets, etc., and mid- and large-sized display devices, such as smart televisions, offer touch-type input processing for user convenience.

Display devices capable of touch-type input processing are being developed to provide more functions, and user demands are also becoming more diverse. For example, research is being conducted to replace physical buttons with pressure sensors.

SUMMARY

Embodiments of the present disclosure are directed to a display device with improved pressure sensing sensitivity.

According to an embodiment of the present disclosure, there is provided a display device, including: a frame that includes a plurality of protrusions; a display panel disposed on the frame and that includes a planar portion and a curved portion disposed along at least one end of the planar portion; a pressure sensing unit disposed between the frame and the display panel that overlaps the curved portion and that includes a plurality of first electrodes and a plurality of second electrodes disposed in a different layer from the first electrodes; and a pressure sensing drive unit connected to the plurality of first electrodes and the plurality of second electrodes. Any one of the plurality of second electrodes at least partially overlap any one of the plurality of first electrodes, and at least one of the plurality of protrusions overlaps a region where one of the plurality of first electrodes and one of the plurality of second electrodes overlap each other.

Each of the plurality of protrusions may have an area less than or substantially equal to that of the region where the one of the plurality of first electrodes and the one of the plurality of second electrodes overlap each other.

The top surface of each of the plurality of protrusions may have a curvature radius less than or substantially equal to that of the pressure sensing unit.

The frame may include a base, a support disposed on the base, and a spacer that protrudes from the support at one end of the support; and the plurality of protrusions may protrude from the support and have a height less than a height of the spacer.

The top surface of the support may have a curvature substantially identical to that of the curved portion of the display panel.

The plurality of first electrodes may extend in a first direction, and the plurality of second electrodes may extend in a second direction that intersects the first direction.

Each of the plurality of protrusions may extend in the first direction, and may have a width less than or substantially equal to a width of any one of the plurality of first electrodes.

Each of the plurality of protrusions may extend in a second direction, and may have a width less than or substantially equal to a width of any one of the plurality of second electrodes.

The display device may further include a plurality of variable resistor members. Each of the variable resistor members may be disposed between one of the plurality of first electrodes and one of the plurality of second electrodes.

The region where the one of the plurality of first electrodes and the one of the plurality of second electrodes may overlap each other overlaps at least two of the plurality of protrusions.

Each of the plurality of protrusions may have one of a semicircular-sectional shape, a polygonal column shape, a cylindrical column shape, a polygonal pyramid shape, or a cone shape.

The display panel may include a plurality of pixels; and the region where the one of the plurality of first electrodes and the one of the plurality of second electrodes overlap each other may have an area greater than that of any one of the plurality of protrusions.

According to another embodiment of the present disclosure, there is provided a display device, including: a frame that includes a base, a support disposed on the base, and a plurality of protrusions that protrude from the support; a display panel disposed on the frame and that includes a planar portion and a curved portion disposed along at least one end of the planar portion; and a pressure sensing unit disposed between the frame and the display panel and that includes a plurality of first electrodes and a plurality of second electrodes disposed in a different layer from the first electrodes. Any one of the plurality of second electrodes at least partially overlaps any one of the plurality of first electrodes, and at least one of the plurality of protrusions overlaps a region where one of the plurality of first electrodes and one of the plurality of second electrodes overlap each other.

The display device may further include a pressure sensing drive unit connected to the plurality of first electrodes and the plurality of second electrodes.

The top surface of the support may have a shape substantially identical to that of the display panel.

The base may come into contact with at least one side surface of the display panel and the pressure sensing unit.

The support may overlap both the planar portion and the curved portion.

The display device may further include a window disposed on the display panel.

The display device may further include a touch sensing unit disposed between the window and the display panel.

According to another embodiment of the present disclosure, there is provided a display device, including: a frame that includes a plurality of protrusions; a display panel disposed on the frame and that includes a planar portion and a curved portion disposed along at least one end of the planar portion; a pressure sensing unit disposed between the frame and the display panel and that includes a plurality of first electrodes that extend in a first direction, a plurality of second electrodes that extend in a second direction that intersects the first direction, and a plurality of variable resistor members; and a pressure sensing drive unit connected to the plurality of first electrodes and the plurality of second electrodes. The pressure sensing unit includes a plurality of unit pressure sensors, where each of the plurality of unit pressure sensors is connected to one of the plurality of first electrodes, one of the plurality of second electrodes that overlap the one of the plurality of first electrodes, and a variable resistor member disposed between the one of the plurality of first electrodes and the one of the plurality of second electrodes, and at least one of the plurality of protrusions overlaps one of the unit pressure sensors.

Each of the plurality of protrusions may have an area less than or substantially equal to an area of the unit pressure sensor.

The unit pressure sensor may overlap at least two of the plurality of protrusions.

The pressure sensing unit may be curved and the top surface of each of the plurality of protrusions may have a curvature radius less than or substantially equal to a curvature radius of the pressure sensing unit.

DETAILED DESCRIPTION

Figure 1:
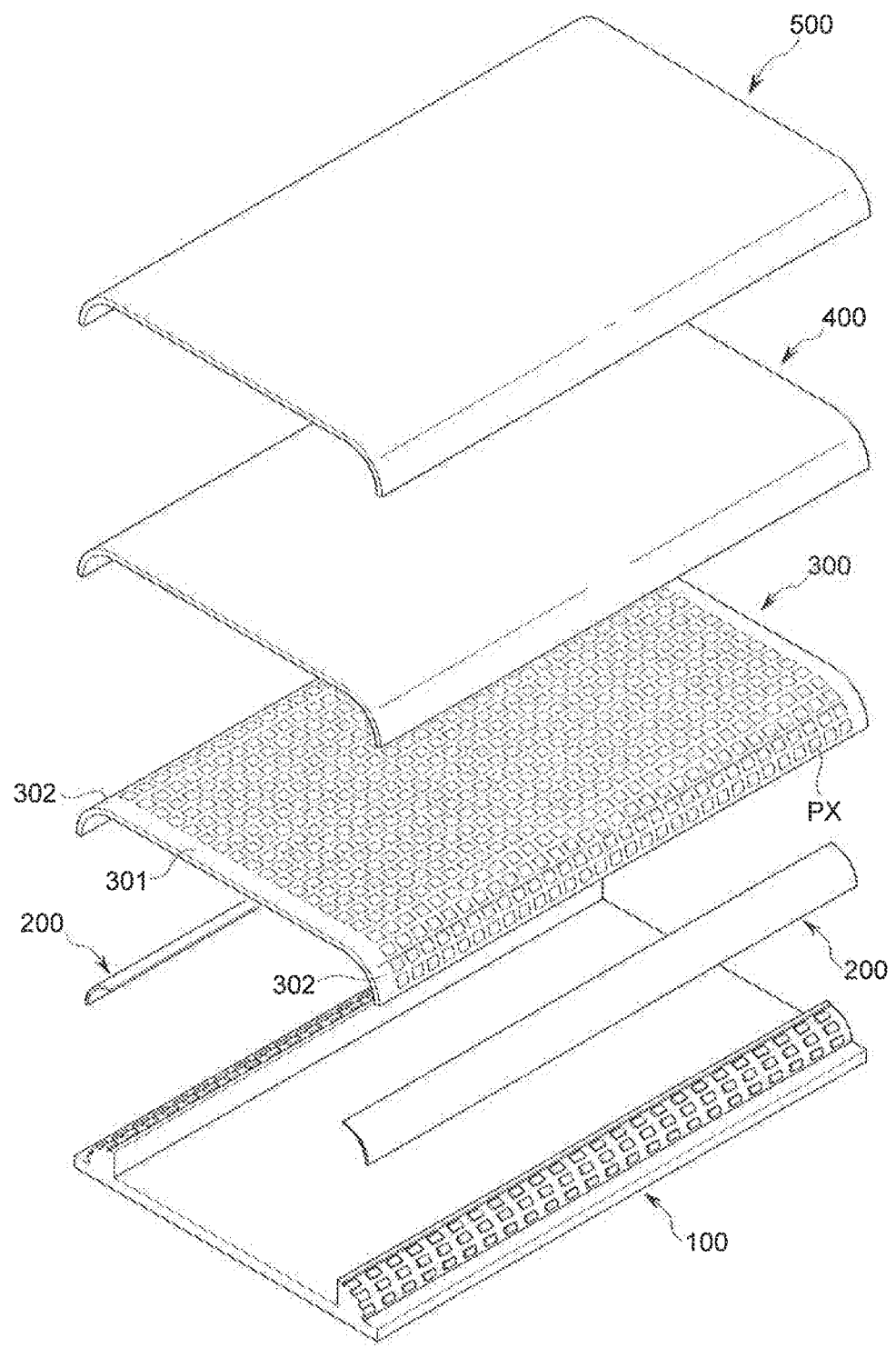
FIG. 1 is an exploded perspective view of a display device according to an exemplary embodiment of the present disclosure.

Embodiments of the present disclosure will be described in detail below with reference to the accompanying drawings.

Although the present disclosure may be subjected to various modifications and may be practiced in various forms, only specific exemplary embodiments will be illustrated in the drawings, and the following description will be given with a focus on the exemplary embodiments. However, the scope of exemplary embodiments is not limited to the specific exemplary embodiments, and all modifications, equivalents or substitutions included in the technical spirit and range of exemplary embodiments should be construed as falling within the scope of embodiments of the present disclosure.

Throughout the specification, when any portion is described as being "connected" to another portion, this includes both a case where the former portion is "directly connected" to the latter portion and a case where the former portion is "electrically connected" to the latter portion through a third portion.

Throughout the specification, the same reference symbols may be assigned to the same or similar components.

A display device according to an exemplary embodiment of the present disclosure will be described in detail with reference to FIGS. 1 to 11.

Figure 2:
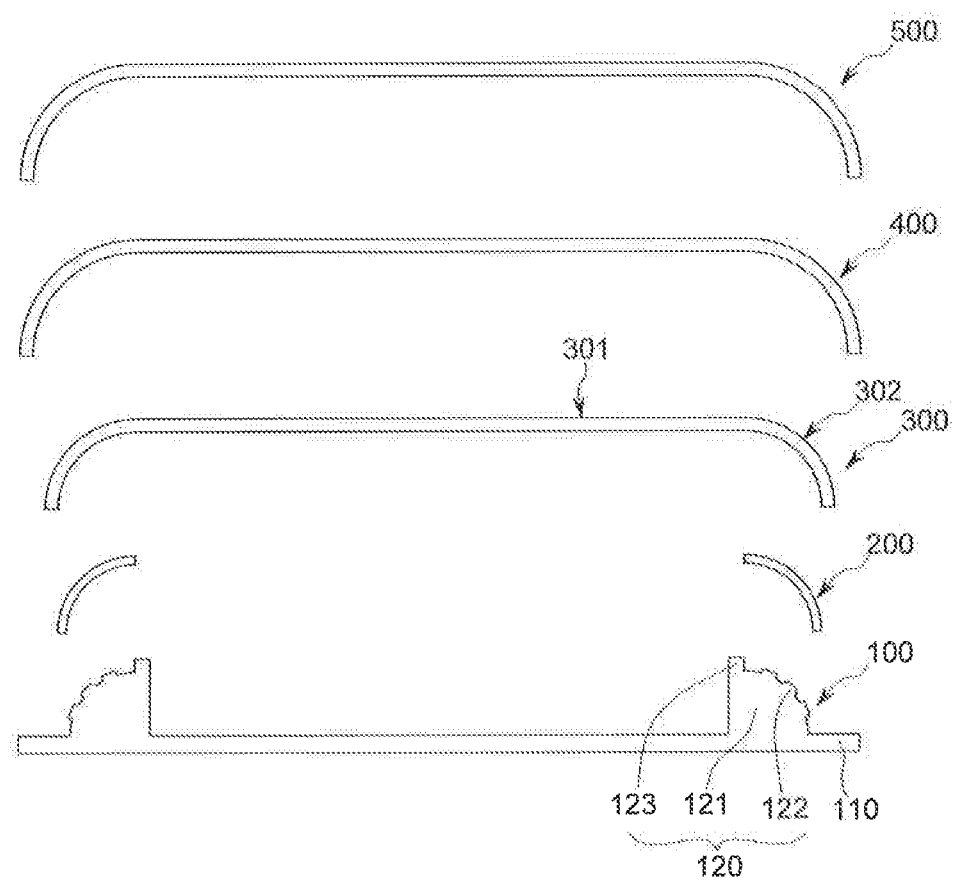
FIG. 2 is an exploded sectional view of a display device according to an exemplary embodiment.
Figure 3:
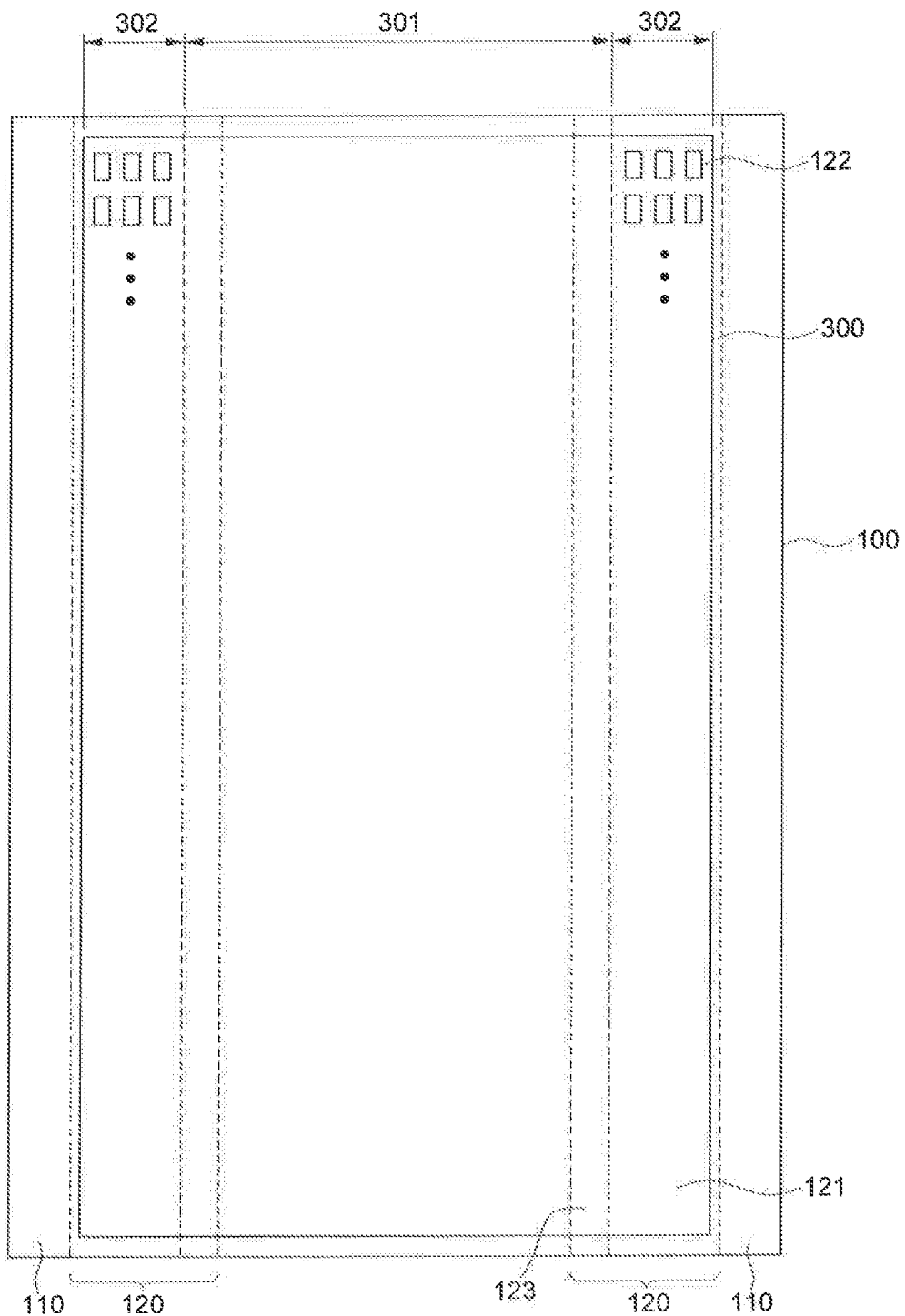
FIG. 3 is a plan view of a frame according to an exemplary embodiment.
Figure 4:
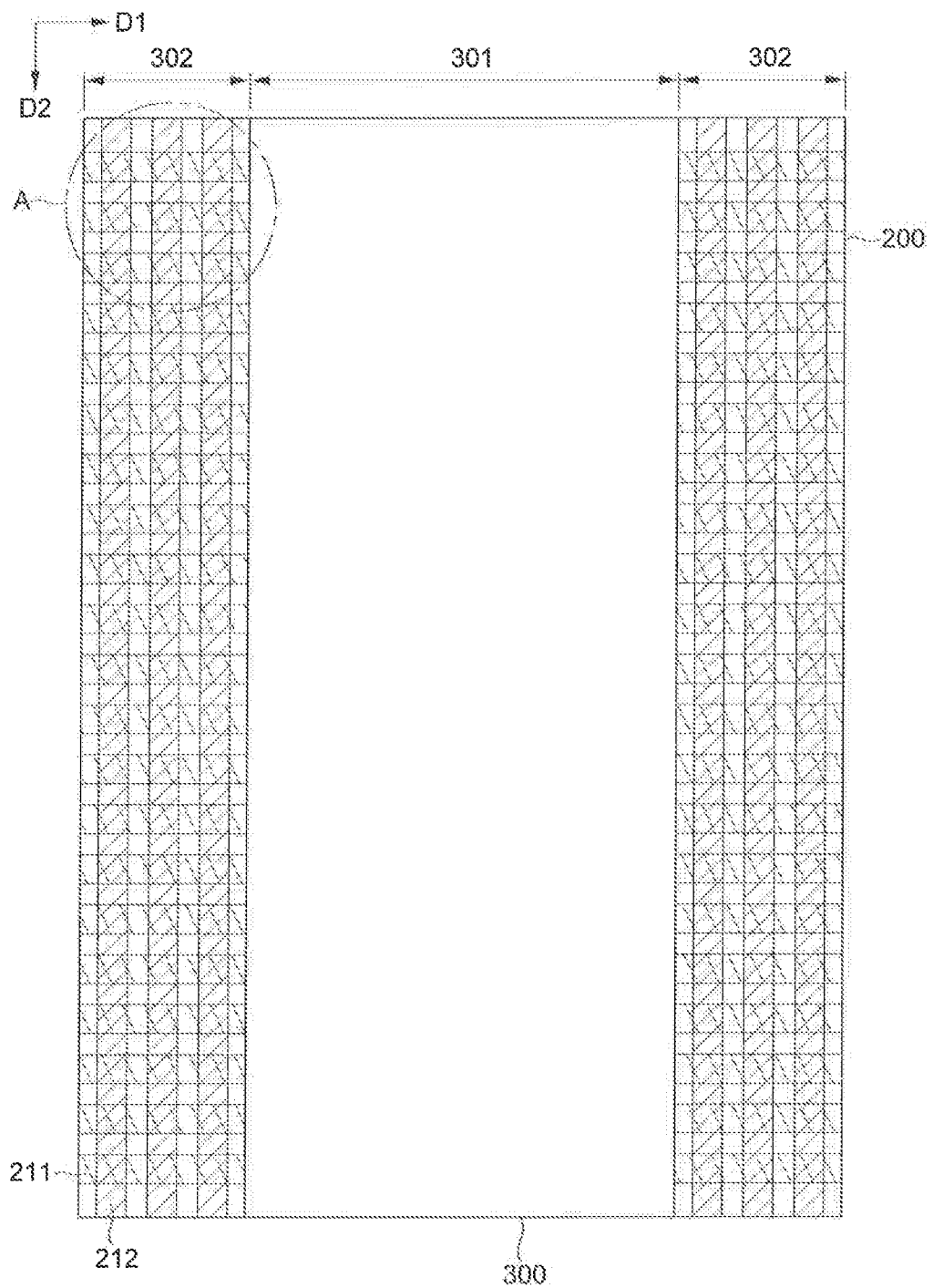
FIG. 4 is a planar figure of a pressure sensing unit according to an exemplary embodiment.
Figure 5:
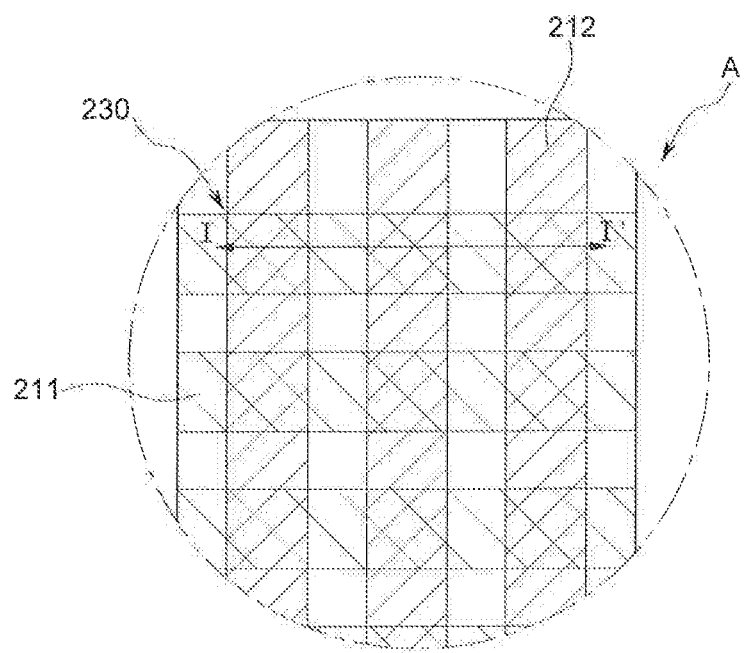
FIG. 5 is an enlarged view of portion A of FIG. 4.
Figure 6:
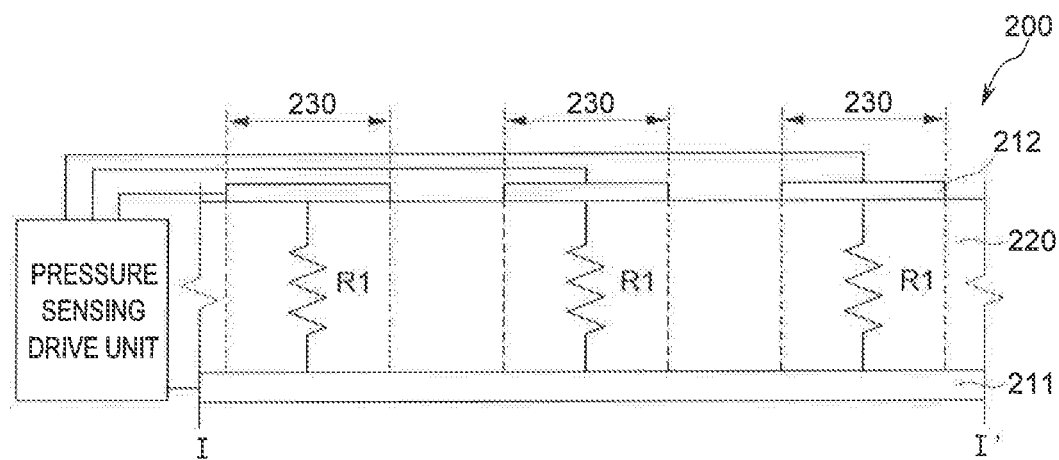
FIG. 6 is a sectional view taken along line I-I' of FIG. 5.
Figure 7:
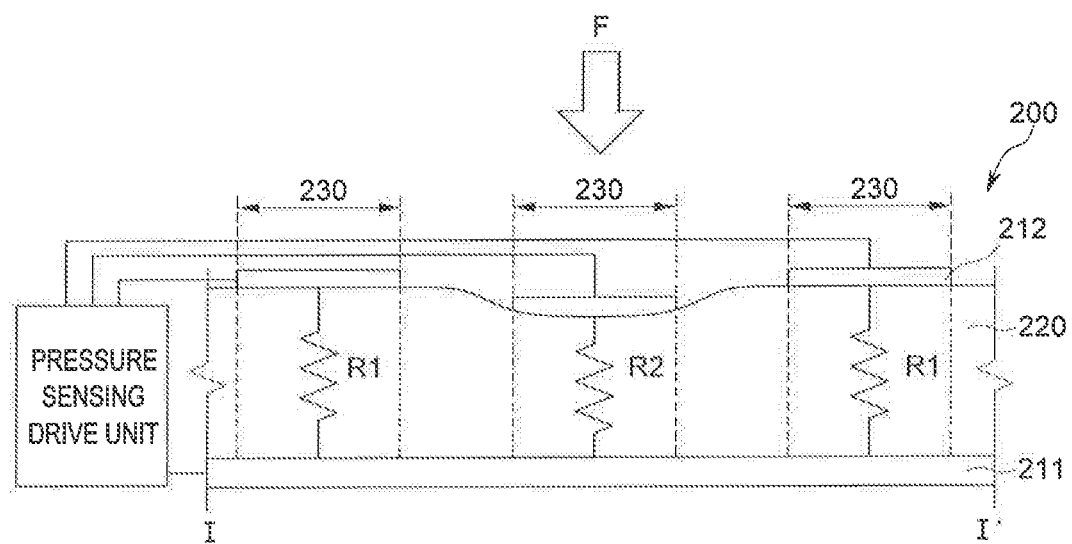
FIG. 7 is another sectional view taken along line I-I' of FIG. 5.

FIG. 1 is an exploded perspective view of a display device according to an exemplary embodiment of the present disclosure. FIG. 2 is an exploded sectional view of a display device according to a present exemplary embodiment. FIG. 3 is a plan view of a frame according to a present exemplary embodiment. FIG. 4 is a planar figure of a pressure sensing unit according to a present exemplary embodiment. FIG. 5 is an enlarged view of portion A of FIG. 4. FIG. 6 is a sectional view taken along line of FIG. 5. FIG. 7 is another sectional view taken along line I-I' of FIG. 5.

Referring to FIGS. 1 and 2, a display device according to a present exemplary embodiment includes a frame 100, pressure sensing units 200, a display panel 300, a touch sensing unit 400, and a window 500.

The frame 100 according to a present exemplary embodiment includes a base portion 110 and protrusion portions 120.

As shown in FIG. 1, the frame 100 overlaps planar portion 301 and curved portions 302 of the display panel 300. Furthermore, although not shown in the drawings, the frame 100 has openings at locations which overlap the planar portions 301 of the display panel 300.

According to an exemplary embodiment, the base portion 110 is disposed under the display panel 300 on the front side of the display device.

According to an exemplary embodiment, the protrusion portions 120 protrude from the base portion 110 at locations that correspond to the curved portions 302 of the display panel 300. In other words, the protrusion portions 120 overlap the curved portions 302 of the display panel 300 and have a curvature substantially identical to that of the curved portions 302 of the display panel 300. The protrusion portions 120 support the display panel 300, the touch sensing unit 400, and the window 500. Each of the protrusion portions 120 include a support 121, a plurality of protrusions 122 that protrude from the support 121, and a spacer 123.

As shown in FIGS. 1 to 3, according to an exemplary embodiment, the plurality of protrusions 122 are arranged in a matrix form. For example, the plurality of protrusions 122 have the form of islands that are spaced apart from each other by predetermined intervals. The protrusions 122 support the pressure sensing units 200, the display panel 300, the touch sensing unit 400, and the window 500. In this case, the protrusions 122 are lower than the spacers 123 to be described below. The spacer 123 protrudes from a corresponding support 121, and is disposed on one end of the support 121. The spacers 123 support the display panel 300, the touch sensing unit 400, and the window 500. Furthermore, the spacers 123 create spaces where the pressure sensing units 200 can be disposed, along with the ends of the base portion 110. The spacers 123 support the display panel 300, the touch sensing part 400 and the window 500 but not the pressure sensing units 200 since the pressure sensing units 200 are not disposed on the spacers 123, the spacers 123 are higher than the protrusions 122.

The pressure sensing units 200 according to a present exemplary embodiment are disposed at locations that correspond to the curved portions 302 of the display panel 300. In other words, the pressure sensing units 200 overlap the curved portions 302 of the display panel 300 and have a curvature substantially identical to that of the curved portions 302 of the display panel 300.

Referring to FIGS. 4 to 7, according to an exemplary embodiment, each of the pressure sensing units 200 include a plurality of first electrodes 211, a plurality of second electrodes 212, and variable resistor members 220 disposed between the plurality of first electrodes 211 and the plurality of second electrodes 212.

According to an exemplary embodiment, each of the pressure sensing units 200 includes a plurality of unit pressure sensors 230. In this case, each of the unit pressure sensors 230 corresponds to a single first electrode 211, a single second electrode 212 that overlaps the single first electrode 211, and a variable resistor member 220 disposed between the single first electrode 211 and the single second electrode 212.

According to an exemplary embodiment, a single unit pressure sensor 230 is larger than or substantially the same size as a single pixel PX to be described below. However, the size of the single unit pressure sensor 230 is not limited thereto, and the single unit pressure sensor 230 may be smaller than the single pixel PX.

According to an exemplary embodiment, the first electrode 211 includes a conductive material. The conductive material includes a metal or an alloy thereof. The metal may include gold (Au), silver (Ag), aluminum (Al), molybdenum (Mo), chromium (Cr), titanium (Ti), nickel (Ni), neodymium (Nd), copper (Cu), platinum (Pt), etc. Furthermore, the first electrode 211 includes a transparent conductive material. The transparent conductive material may include silver nanowires (AgNWs), indium tin oxide (ITO), indium zinc oxide (IZO), antimony zinc oxide (AZO), indium tin zinc oxide (ITZO), zinc oxide (ZnO), tin oxide (SnO$_2$), carbon nanotubes, graphene, etc.

Referring to FIG. 4, according to an exemplary embodiment, the plurality of first electrodes 211 form stripes that extend in a first direction D1. However, the shape of the plurality of first electrodes 211 is not limited thereto, and the plurality of first electrodes 211 may have any of various shapes. In this case, the plurality of first electrodes 211 are spaced apart from each other by predetermined intervals in a second direction D2 that crosses the first direction. However, the interval of the plurality of first electrodes 211 is not limited thereto, and the plurality of first electrodes 211 may be spaced apart from each other at different intervals.

According to an exemplary embodiment, the second electrodes 212 are spaced apart from the first electrodes 211 and include a conductive material. The second electrodes 212 and the first electrodes 211 may include the same material, or may include different materials.

Furthermore, according to an exemplary embodiment, the plurality of second electrodes 212 form stripes that extend in the second direction D2. However, the shape of the second electrodes 212 is not limited thereto, and the plurality of second electrodes 212 may have any of various shapes. In this case, the plurality of second electrodes 212 are spaced apart from each other by predetermined intervals in the first direction. However, the interval of the plurality of second electrodes 212 is not limited thereto, and the plurality of second electrodes 212 may be spaced apart from each other at different intervals.

According to an exemplary embodiment, each of the variable resistor members 220 are disposed between a corresponding first electrode 211 and a corresponding second electrode 212 in a region where the first electrode 211 and the second electrode 212 overlap each other.

According to an exemplary embodiment, the variable resistor member 220 includes a material whose electrical characteristics vary based on the extent of a deformation. In particular, the variable resistor member 220 includes a material whose resistance R1 between the first electrode 211 and the second electrode 212 varies according to an externally applied pressure. When no pressure is applied to a corresponding unit pressure sensor 230, the first electrode 211 and the second electrode 212 are spaced apart from each other by a first distance with the variable resistor member 220 interposed therebetween, and the variable resistor member 220 has first resistance R1. As shown in FIGS. 6 and 7, when a pressure F is applied to the unit pressure sensor 230 by a user's touch, etc., the distance between the first electrode 211 and the second electrode 212 varies, and the shape of the variable resistor member 220 changes. In other words, the resistance of the variable resistor member 220 changes from the first resistance R1 to a second resistance R2. In other words, as force applied to the variable resistor member 220 increases, the resistance of the variable resistor member 220 decreases (R1>R2). Conversely, as force applied to the variable resistor member 220 decreases, the resistance of the variable resistor member 220 increases. Accordingly, the strength of the pressure can be detected by detecting the change in resistance.

According to an exemplary embodiment, the variable resistor member 220 includes a material whose resistance varies according to pressure. More specifically, the variable resistor member 220 includes a force sensitive material or a material referred to as a "force sensitive resistor." For example, the variable resistor member 220 includes a piezoelectric material such as lead zirconate titanate (PZT), polyvinylidene fluoride (PVDF), carbon powder, quantum tunneling composite (QTC), silicone, carbon nanotubes, or graphene. Furthermore, the variable resistor member 220 includes nanoparticles. The nanoparticles may be provided as nanotubes, nanocolumns, nanorods, nanopores, nanowires, etc. The nanoparticles include particles of any one of carbon, graphite, a metalloid, a metal, a conductive oxide of a metalloid and a metal, and conductive nitrides of a metalloid and a metal, or include particles having a core shell structure in which insulating beads are coated with the particles, or combination thereof. The metalloid may be antimony (Sb), germanium (Ge), arsenic (As), or an alloy thereof. The metal may be zinc (Zn), aluminum (Al), scandium (Sc), chromium (Cr), manganese (Mn), iron (Fe), cobalt (Cu), nickel (Ni), copper (Cu), indium (In), tin (Sn), yttrium (Y), zirconium (Zr), niobium (Nb), molybdenum (Mo), ruthenium (Ru), rhodium (Rh), palladium (Pd), gold (Au), silver (Ag), platinum (Pt), strontium (Sr), tungsten (W), cadmium (Cd), tantalum (Ta), titanium (Ti), or an alloy thereof. The conductive oxide may beindium tin oxide (ITO), indium zinc oxide (IZO), aluminum-doped zinc oxide (AZO), gallium indium zinc oxide (GIZO), zinc oxide (ZnO), or a mixture thereof.

As shown in FIGS. 4 and 5, according to an exemplary embodiment, each of the unit pressure sensors 230 is a region where a corresponding first electrode 211, a corresponding second electrode 212, and a corresponding variable resistor member 220 overlap one another, and the region has a rectangular planar shape. However, the shape of the unit pressure sensors 230 is not limited thereto, and the unit pressure sensor 230 may have any of various shapes to improve sensitivity.

As shown in FIGS. 6 and 7, according to an exemplary embodiment, the pressure sensing units 200 are connected to a pressure sensing drive unit. The pressure sensing drive unit receives a resistance signal from the pressure sensing units 200, and calculates the magnitude and location of the pressure applied to the display device.

Since the pressure sensing units 200 according to a present exemplary embodiment detect not only the location of pressure applied to the display device but also the magnitude of the pressure, a display device according to embodiments of the present disclosure can perform different operations, depending on the magnitude of pressure, and, thus, can provide a greater variety of user interfaces/user experiences (Uis/UXs) to a user.

The display panel 300 according to a present exemplary embodiment may be a flexible display panel. Alternatively, the display panel 300 according to a present exemplary embodiment may be a bent display panel with curved edges. The display panel 300 may be formed to have curved edges, or may be fabricated to be flat and then have its edges curved by coupling with the window 500 or frame 100.

In the following, for ease of description, the central flat portion of the display panel 300 is referred to as the "planar portion 301", and curved portions along the edges of the planar portion 301 are referred to as the "curved portions 302". Although the display panel 300 according to a present exemplary embodiment has been illustrated in the state in which the curved portions 302 are formed along both edges of the planar portion 301, the disposition of the curved portions 302 is not limited thereto, and a curved portion 302 may be formed along a single edge of the planar portion 301. The planar portion 301 and the curved portions 302 are conceptually divided for ease of description, and can actually be a single display region.

According to an exemplary embodiment, the display panel 300 includes a plurality of pixels PX that can display an image. The plurality of pixels PX are arranged on the planar portion 301 and curved portions 302 of the display panel 300, and can display an image.

According to an exemplary embodiment, the display panel 300 includes a flexible film, such as a plastic film, and is implemented by arranging organic LEDs and pixel circuits on the flexible film.

According to an exemplary embodiment, the touch sensing unit 400 is disposed on the display panel 300 and can detect a touch operation of a user. Although the touch sensing unit 400 according to a present exemplary embodiment has been illustrated as a separate component that is disposed between the display panel 300 and the window 500, the configuration of the touch sensing unit 400 is not limited thereto, and the touch sensing unit 400 can be implemented directly inside and integrated with the display panel 300.

The touch sensing unit 400 may be any one of a capacitance touch sensor, a pressure touch sensor, an optical touch sensor, or an ultrasonic touch sensor.

According to an exemplary embodiment, the window 500 is disposed on the touch sensing unit 400. The window 500 includes a transparent soft material that protects the display panel 300 from external shocks while transmitting an image from the display panel 300 therethrough. Furthermore, the window 500 includes a flexible film material, such as a plastic film. More specifically, the window 500 is a reinforced coating film on which a tempered glass or reinforced coating layer is disposed. For example, the window 500 is a transparent film that includes any one of polyethylene naphthalate (PEN), polyethylene terephthalate (PET), polycarbonate (PC), or polystyrene sulfonate (PSS). The window 500 is not limited thereto, and may be a synthetic resin material film on which a reinforced coating can be formed. Furthermore, the reinforced coating layer can be formed by applying resin, such as silicone (Si) or ceramic, or can be formed through vacuum deposition.

The window 500 according to an embodiment of the present disclosure has substantially the same shape as the display panel 300. For example, when the display panel 300 has the planar portion 301 and the curved portions 302 disposed along the edges of the planar portion 301, the window 500 also has a planar portion and curved portions that respectively correspond to the planar portion 301 and curved portions 302 of the display panel 300.

Figure 8:
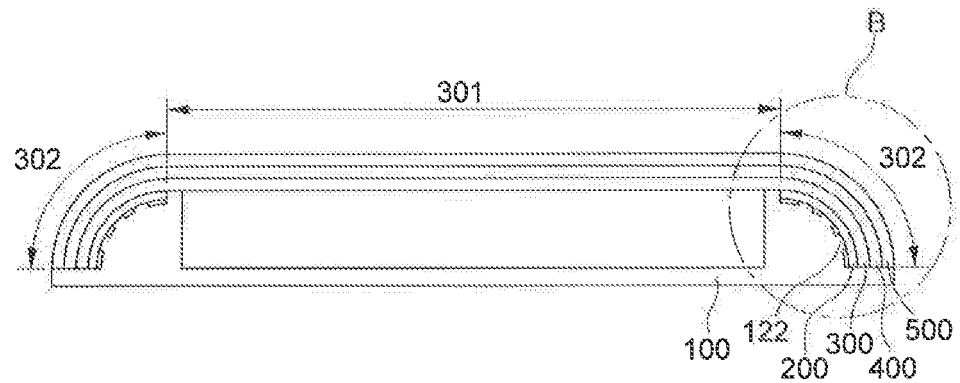
FIG. 8 is a sectional view of a display device according to an exemplary embodiment.
Figure 9:
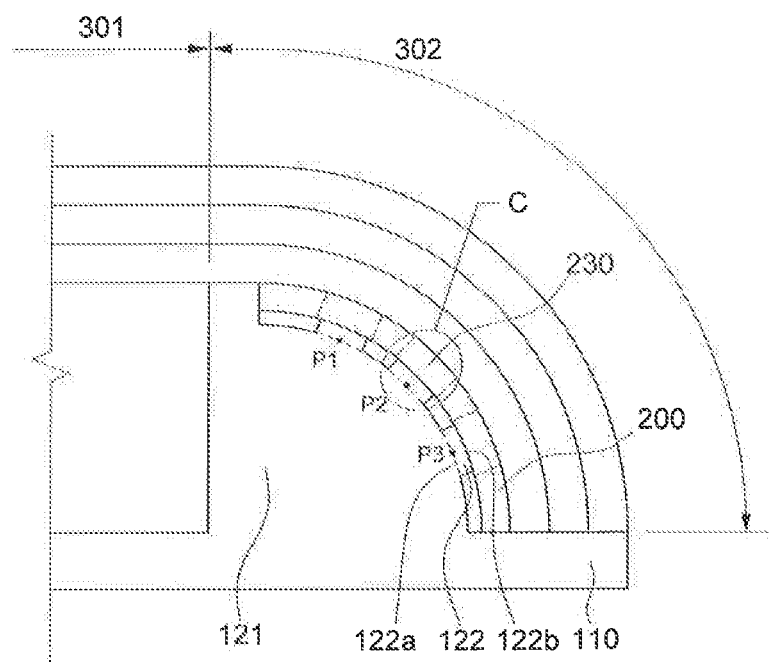
FIG. 9 is an enlarged view of portion B of FIG. 8.

FIG. 8 is a sectional view of a display device according to a present exemplary embodiment, FIG. 9 is an enlarged view of portion B of FIG. 8. FIGS. 10a to 10e are enlarged views of portion C of FIG. 9. FIG. 11 is an enlarged plan view of a protrusion and a pressure sensing unit according to a present exemplary embodiment.

According to a present exemplary embodiment, as shown in FIG. 8, a plurality of protrusions 122 are disposed on each of the curved portions 302 of a display panel 300. The plurality of protrusions 122 come into contact with a corresponding pressure sensing unit 200. However, the plurality of protrusions are not limited thereto, are the plurality of protrusions 122 need not come into contact with the pressure sensing unit 200.

According to a present exemplary embodiment, a single unit pressure sensor 230 corresponds to one of the protrusions 122. In other words, the single unit pressure sensor 230 overlaps the corresponding protrusion 122.

According to an exemplary embodiment, the pressure sensing units 200, the display panel 300, a touch sensing unit 400, and a window 500 have substantially the same curvature radius on the curved portions 302. Referring to FIGS. 8 and 9, an outer surface of at least part of the protrusion portion 120 has substantially the same curvature radius as an inner surface of a corresponding pressure sensing units 200. More specifically, the surface of the protrusion portion 120 opposite to the pressure sensing unit 200 has substantially the same curvature radius as the inner surface of the pressure sensing unit 200. For example, when the centers of the bottom surfaces 122a of the plurality of protrusions 122 protruding from a support 121 are defined as a first point P1, a second point P2, and a third point P3, respectively, an imaginary curved line connecting the first point P1, the second point P2, and the third point P3 has substantially the same curvature radius as the inner surface of the pressure sensing unit 200.

Figure 10A:
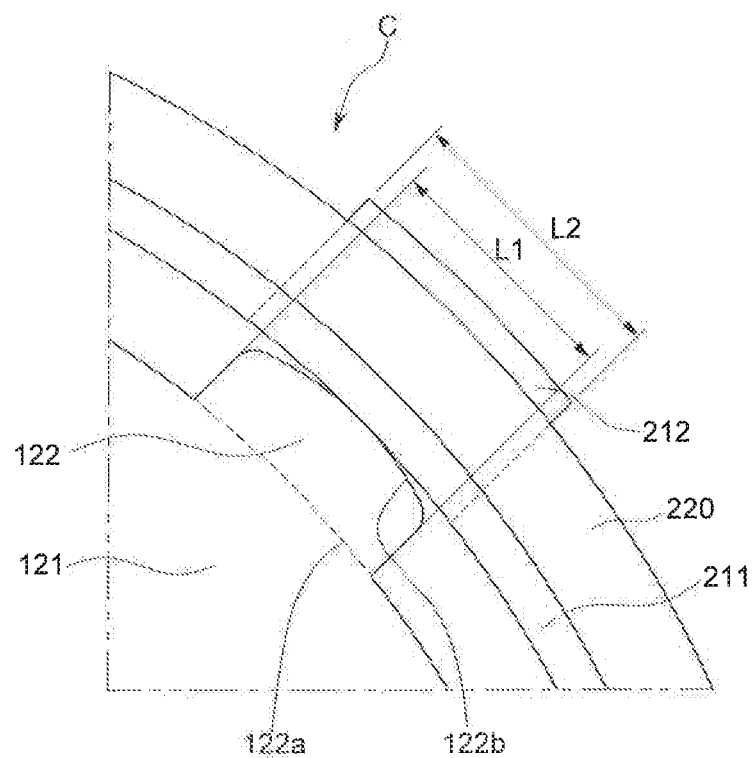
FIGS. 10A to 10C are enlarged views of portion C of FIG. 9.
Figure 10B:
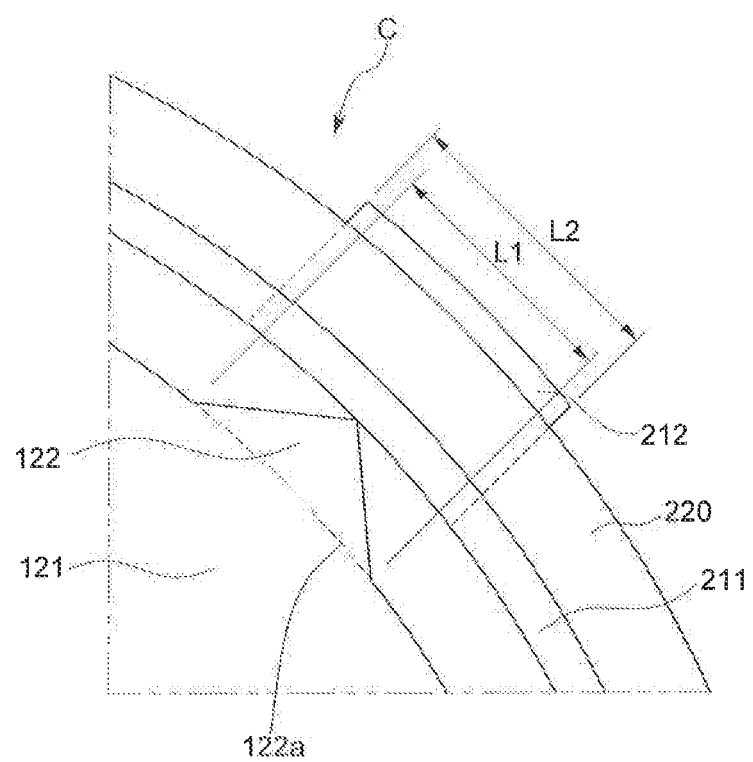
Figure 10C:
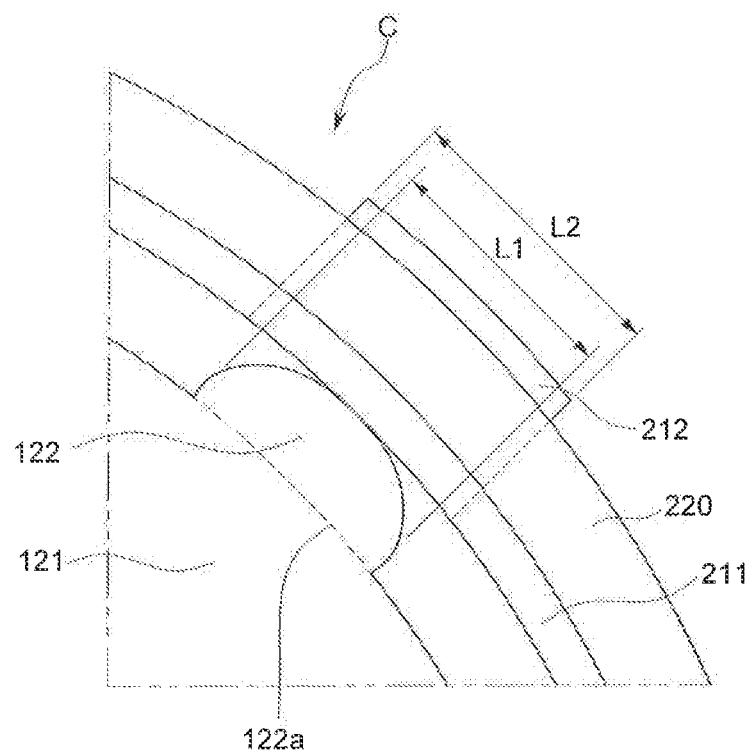
Figure 11:
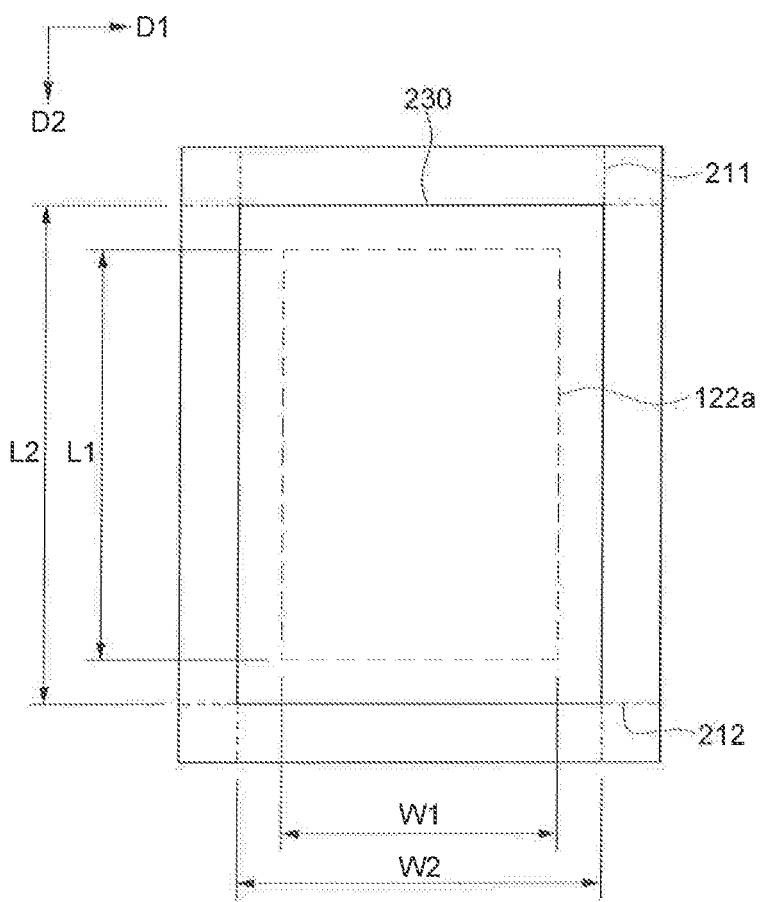
FIG. 11 is an enlarged plan view of a protrusion and a pressure sensing unit according to an exemplary embodiment.

Referring to FIG. 10A, according to a present exemplary embodiment, each of the plurality of protrusions 122 has any one of a polygonal column shape, a cylindrical column shape, a polygonal pyramid shape, or a cone shape. For example, each of the plurality of protrusions 122 has a square column shape or a cylindrical column shape. In this case, the top surface 122b of each of the plurality of protrusions 122 has a curvature radius that is less than or substantially the same as the curvature radius of the pressure sensing unit 200. More specifically, the top surface 122b of each of the plurality of protrusions 122 has a curvature radius that is less than or substantially the same as a curvature radius of a corresponding unit pressure sensor 230. Accordingly, the plurality of protrusions 122 can be prevented from damaging the unit pressure sensors 230 in contact with the plurality of protrusions 122, which can facilitate the assembly process of the display device. In addition, each of the plurality of protrusions 122 may have a polygonal pyramid shape or a cone shape, as shown in FIG. 10B, or may have a semicircular-sectional shape, as shown in FIG. 10C. However, the shape of each of the plurality of protrusions 122 is not limited thereto, and each of the plurality of protrusions 122 may have any of various shapes that can sensitively measure pressure.

Referring to FIG. 11, according to an exemplary embodiment, each of the plurality of protrusions 122 has a rectangular planar shape. However, the shape of each of the plurality of protrusions 122 is not limited thereto, and each of the plurality of protrusions 122 may have any of various planar shapes, such as a polygonal shape, a circular shape, an elliptical shape, etc.

According to a present exemplary embodiment, each of the plurality of protrusions 122 is smaller than or substantially the same size as a corresponding unit sensor 230. In other words, each of the plurality of protrusions 122 is smaller than or substantially the same size as a region where a corresponding first electrode 211 and a corresponding second electrode 212 overlap each other. More specifically, the bottom surface 122a of each of the plurality of protrusions 122 is smaller than or substantially the same size as the region where the corresponding first electrode 211 and the corresponding second electrode 212 overlap each other. As shown in FIGS. 10a to 11, a length L1 of the bottom surface 122a of each of the plurality of protrusions 122 is less than or substantially equal to a length L2 of the region where the corresponding first electrode 211 and the corresponding second electrode 212 overlap each other (L1≤L2), and a width W1 of the bottom surface 122a of each of the plurality of protrusions 122 is less than or substantially equal to a width W2 of the region where the corresponding first electrode 211 and the corresponding second electrode 212 overlap each other (W1≤W2). Accordingly, the area of the bottom surface 122a of each of the plurality of protrusions 122 is less than or substantially equal to the area of the region where the corresponding first electrode 211 and the corresponding second electrode 212 overlap each other. For example, any one of the length L1 and width W1 of the bottom surface 122a of each of the plurality of protrusions 122 is less than or equal to 2.5 mm, and any one of the length L2 and width W2 of the area of the overlap region of the corresponding first electrode 211 and of the corresponding second electrode 212 is equal to or greater than 2.5 mm.

Accordingly, a display device according to a present exemplary embodiment can accurately and sensitively detect pressure applied to the display device because pressure is concentrated on each of the protrusions 122, which have a smaller area than a corresponding unit pressure sensor 230.

A display device according to an exemplary embodiment of the present disclosure will be described in detail with reference to FIGS. 12 and 13. Descriptions of a display device according to a present exemplary embodiment that are the same as descriptions of the display device according to an exemplary embodiment of FIGS. 1-11 will be omitted below.

Figure 12:
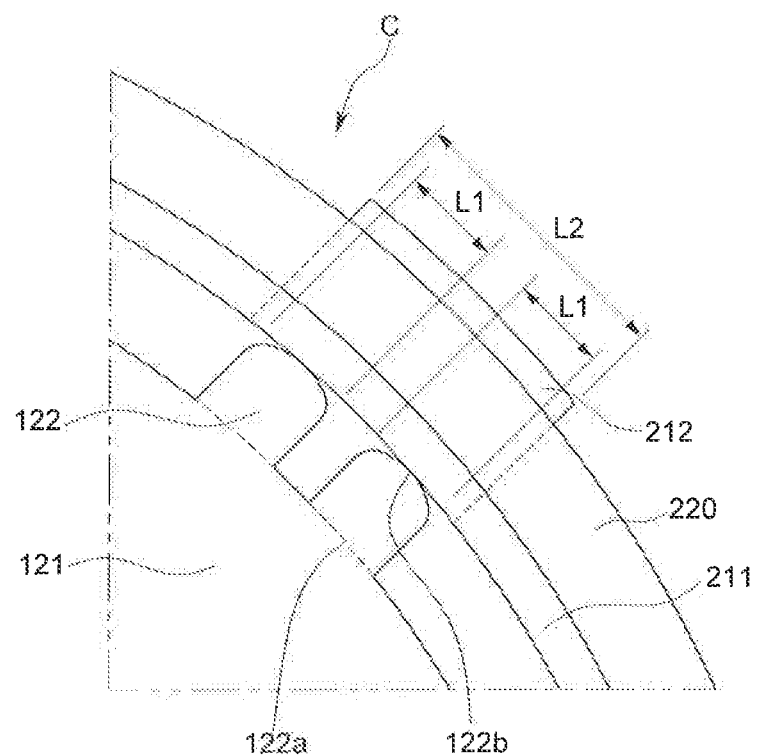
FIG. 12 is an enlarged sectional view of protrusions and a pressure sensing unit according to an exemplary embodiment of the present disclosure.
Figure 13:
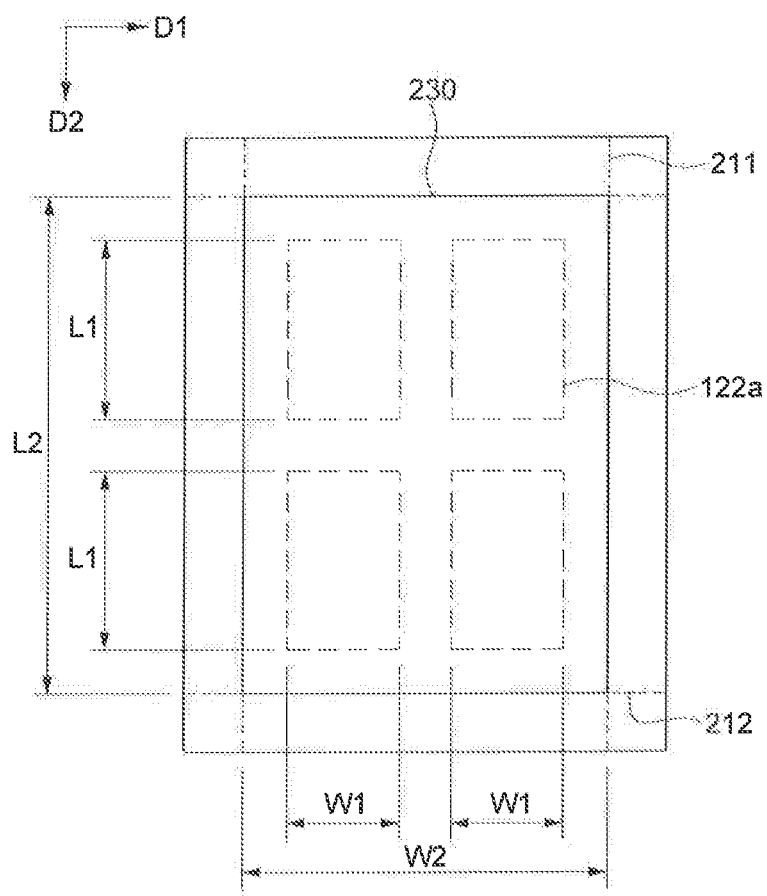
FIG. 13 is an enlarged view of protrusions of a pressure sensing unit according to an exemplary embodiment.

FIG. 12 is an enlarged sectional view of protrusions and a pressure sensing unit according to a present exemplary embodiment, and FIG. 13 is an enlarged plan view of protrusions and a pressure sensing unit according to a present exemplary embodiment.

According to a present exemplary embodiment, each unit pressure sensor 230 corresponds to two or more protrusions 122, as shown in FIGS. 12 and 13. In other words, the single unit pressure sensor 230 overlaps the two or more protrusions 122.

According to a present exemplary embodiment, each of a plurality of protrusions 122 are smaller than a corresponding unit sensor 230. In other words, each of the plurality of protrusions 122 are smaller than a region where a corresponding first electrode 211 and a corresponding second electrode 212 overlap each other. More specifically, the bottom surface 122a of each of the plurality of protrusions 122 is smaller than a region where a corresponding first electrode 211 and a corresponding second electrode 212 overlap each other. The length L1 of the bottom surface 122a of each of the plurality of protrusions 122 is less than the length L2 of the region where the corresponding first electrode 211 and the corresponding second electrode 212 overlap each other (L1<L2), and the width W1 of the bottom surface 122a of each of the plurality of protrusions 122 is less than the width W2 of the region where the corresponding first electrode 211 and the corresponding second electrode 212 overlap each other (W1<W2). Accordingly, the area of the bottom surface 122a of each of the plurality of protrusions 122 is less than the area of the region where the corresponding first electrode 211 and the corresponding second electrode 212 overlap each other.

Accordingly, a display device according to a present exemplary embodiment can accurately and sensitively detect pressure applied to the display device because pressure is concentrated on each of the protrusions 122, which has a smaller area than a corresponding unit pressure sensor 230.

A display device according to an exemplary embodiment of the present disclosure will be described in detail with reference to FIGS. 14 to 16. Descriptions of a display device according to a present exemplary embodiment that are the same as descriptions of display devices according to exemplary embodiments of FIGS. 1-13 will be omitted below.

Figure 14:
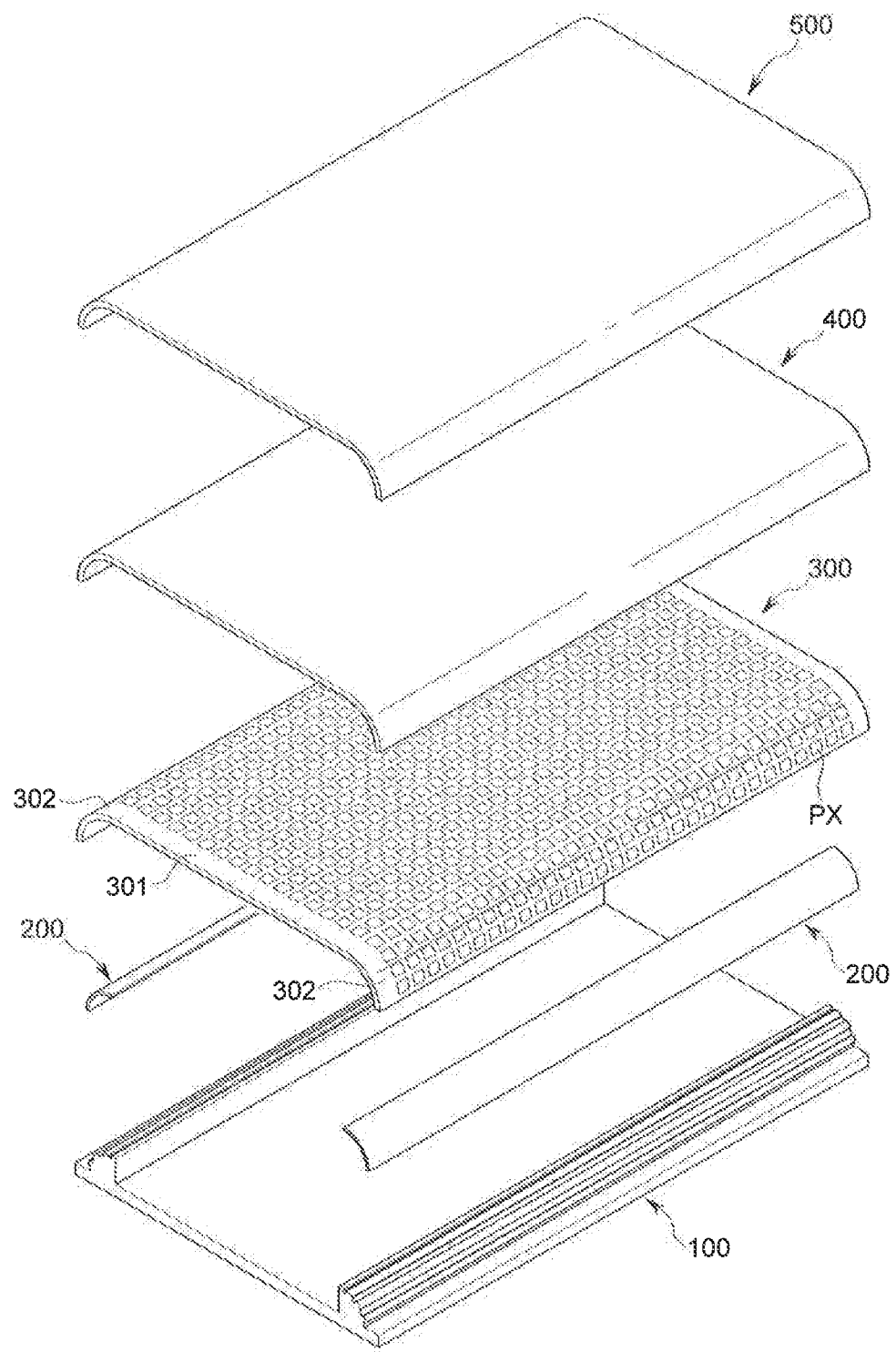
FIG. 14 is an exploded perspective view of a display device according to an exemplary embodiment of the present disclosure.

FIG. 14 is an exploded perspective view of a display device according to a present exemplary embodiment. FIG. 15 is a plan view of a frame according to a present exemplary embodiment. FIG. 16 is an enlarged sectional view of protrusions and a pressure sensing unit according to a present exemplary embodiment.

Figure 15:
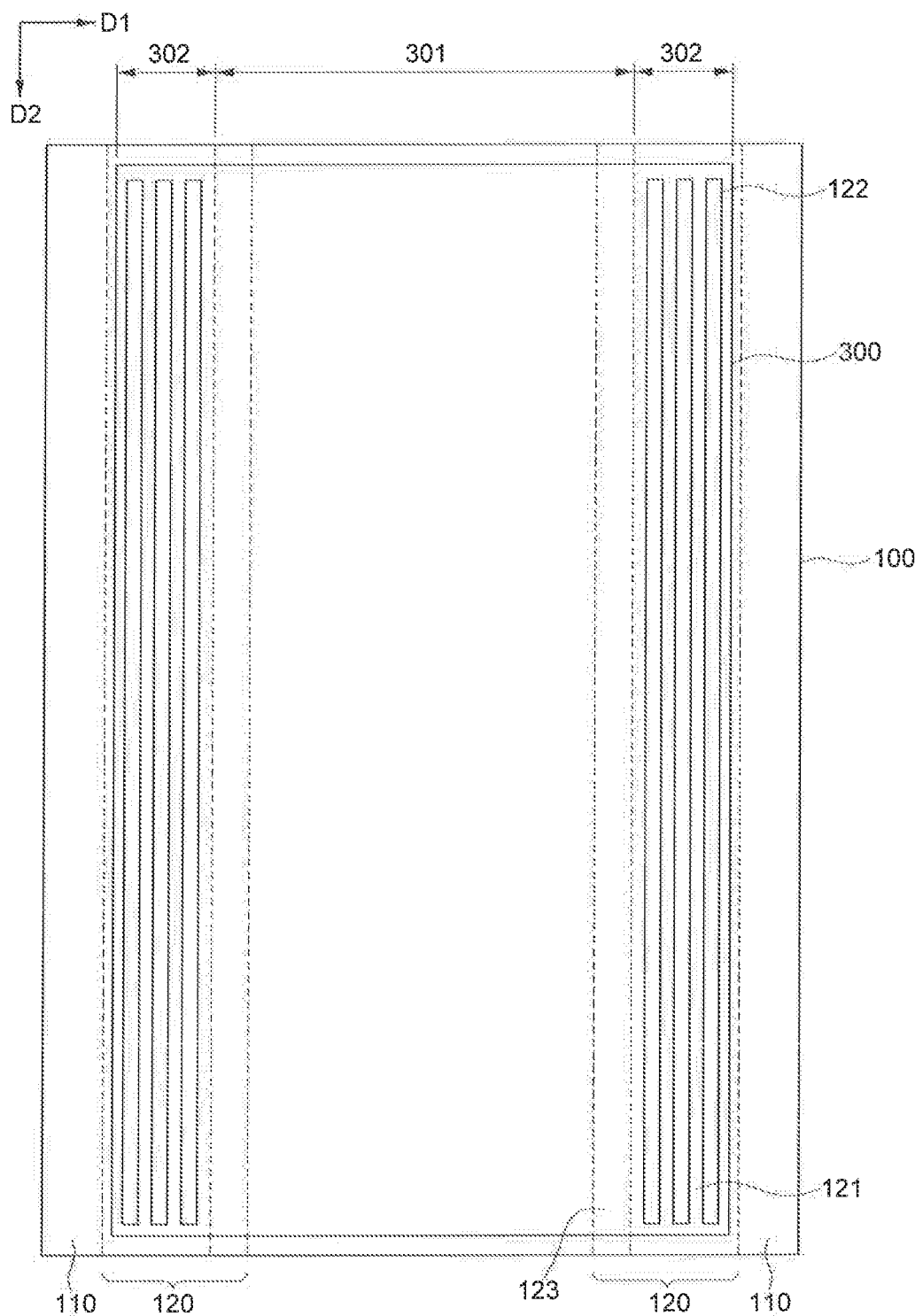
FIG. 15 is a plan view of a frame according to an exemplary embodiment.
Figure 16:
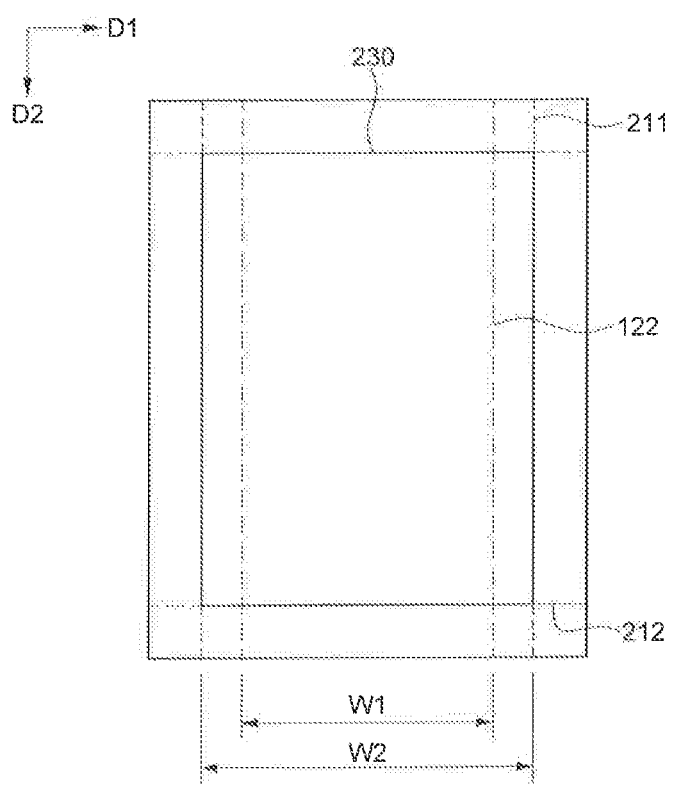
FIG. 16 is an enlarged sectional view of a pressure sensing unit according to an exemplary embodiment.

Referring to FIGS. 14 and 15, according to an exemplary embodiment, a plurality of protrusions 122 have bar shapes that extend in a second direction D2. As shown in FIG. 16, each of the plurality of protrusions 122 overlaps a corresponding first electrode 211 that extends in the second direction D2, and each of the plurality of protrusions 122 have a width W1 that is less than or substantially equal to a width W2 of the corresponding first electrode 211 (W2≥W1).

A display device according to an exemplary embodiment of the present disclosure will be described in detail with reference to FIGS. 17 to 19. Descriptions of a display device according to a present exemplary embodiment that are the same as descriptions of display devices according to exemplary embodiments of FIGS. 1-16 will be omitted below.

Figure 17:
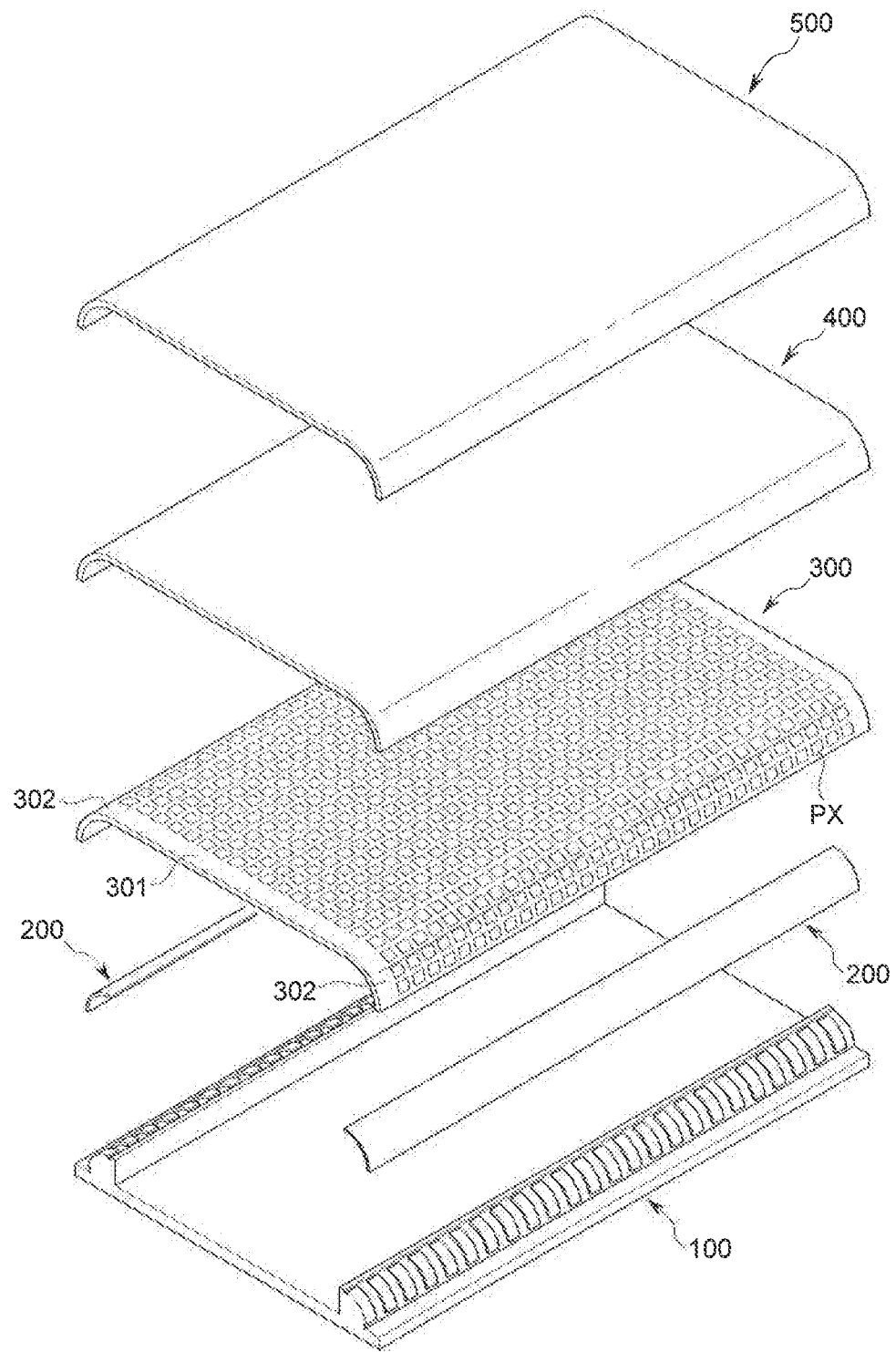
FIG. 17 is an exploded perspective view of a display device according to an exemplary embodiment of the present disclosure.

FIG. 17 is an exploded perspective view of a display device according to a present exemplary embodiment. FIG. 18 is a plan view of a frame according to a present exemplary embodiment. FIG. 19 is an enlarged sectional view of protrusions and a pressure sensing unit according to a present exemplary embodiment.

Figure 18:
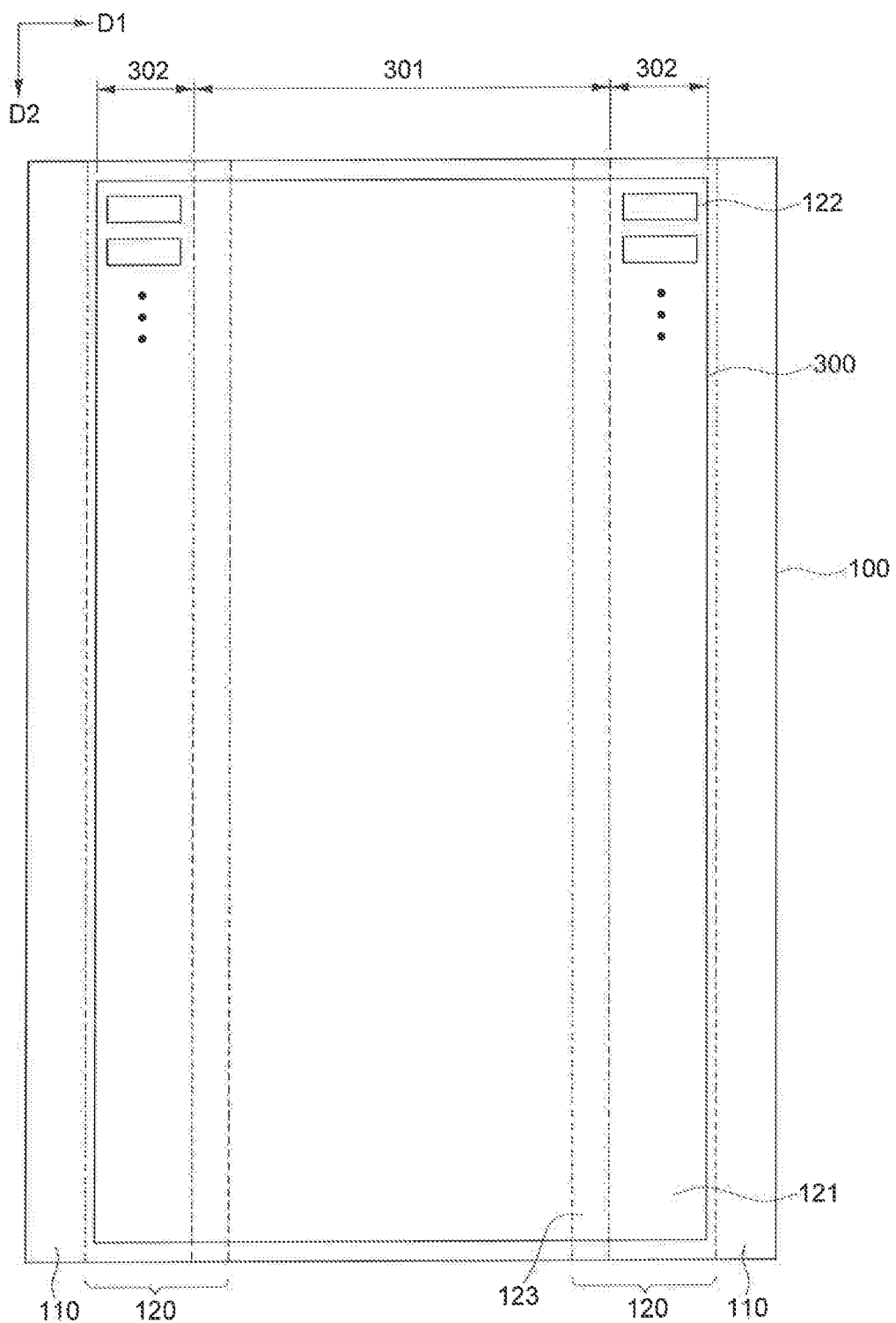
FIG. 18 is a plan view of a frame according to an exemplary embodiment.
Figure 19:
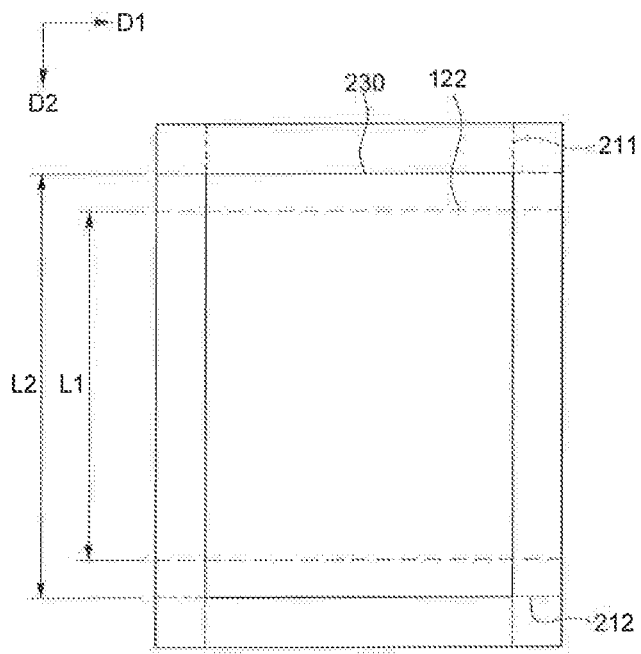
FIG. 19 is an enlarged sectional view of a pressure sensing unit according to an exemplary embodiment.

Referring to FIGS. 17 and 18, according to an exemplary embodiment, a plurality of protrusions 122 have bar shapes that extend in a first direction D1. As shown in FIG. 19, each of the plurality of protrusions 122 overlaps a corresponding second electrode 212 that extends in the first direction D1, and each of the plurality of protrusions 122 has a width L1 that is less than or substantially equal to a width L2 of a corresponding second electrodes 212 (L2≥L1).

A display device according to an exemplary embodiment of the present disclosure will be described in detail with reference to FIG. 20. Descriptions of a display device according to a present exemplary embodiment that are the same as descriptions of the display devices according to exemplary embodiments of FIGS. 1-19 will be omitted below.

Figure 20:
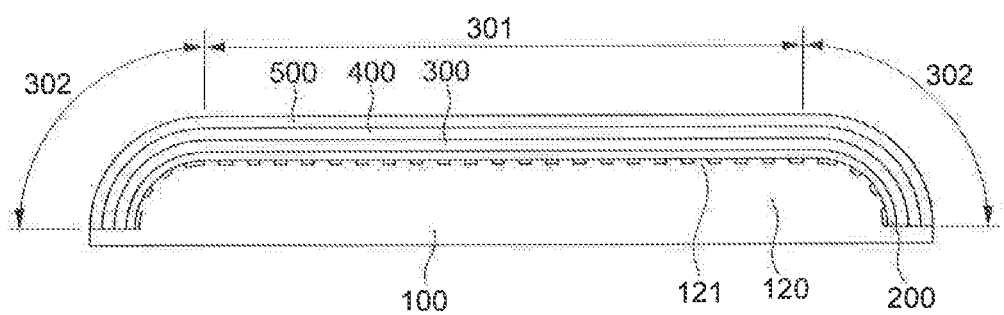
FIG. 20 is a sectional view of a display device according to an exemplary embodiment of the present disclosure.

FIG. 20 is a sectional view of a display device according to a present exemplary embodiment.

Referring to FIG. 20, according to an exemplary embodiment, a display panel 300 is disposed on the protrusion portion 120 of a frame 100, and the protrusion portion 120 of the frame 100 overlaps both the planar portion 301 and the curved portions 302 of the display panel 300. However, the overlap of the protrusion portion 120 with the frame 100 is not limited thereto. In other words, the display panel 300 may be a flat display panel. Accordingly, the protrusion portion 120 of the frame 100 overlaps the overall surface of the display panel 300. More specifically, the protrusion portion 120 of the frame 100 overlaps both the planar portion 301 and the curved portions 302 of the display panel 300. In this case, the top surface of the protrusion portion 120 has substantially the same shape as the display panel 300. For example, the top surface of at least one of the protrusion portions 120 has substantially the same curvature radius as a corresponding curved portion 302 of the display panel 300, and the central portion of the protrusion portion 120 has a flat shape that corresponds with the planar portion 301 of the display panel 300.

According to an exemplary embodiment, a pressure sensing unit 200 is disposed on the protrusion portion 120 of the frame 100 and the display panel 300, and the pressure sensing unit 200 is disposed on both the planar portion 301 and the curved portions 302 of the display panel 300. However, the disposition of the pressure sensing unit 200 is not limited thereto. For example, the display panel 300 may be a flat display panel. Accordingly, the pressure sensing unit 200 overlaps the overall surface of the flat display panel.

According to a present exemplary embodiment, pressure can be more accurately and sensitively detected on an overall surface of the display panel 300.

Although exemplary embodiments of the present disclosure have been described with reference to the accompanying drawings, it will be appreciated by those having ordinary knowledge in the art to which embodiments of the present disclosure pertains that embodiments of the present disclosure can be practiced in different forms without departing from the technical spirit or essential features of embodiments of the present disclosure. Therefore, it should be understood that the above-described exemplary embodiments are illustrative but not limiting in all aspects.

What is claimed is:

1. A display device, comprising:
a frame that includes a plurality of protrusions;
a display panel disposed on the frame and that includes a planar portion and a curved portion disposed along at least one end of the planar portion;
a pressure sensing unit disposed between the frame and the display panel that overlaps the curved portion and that includes a plurality of first electrodes and a plurality of second electrodes; and
a pressure sensing drive unit connected to the plurality of first electrodes and the plurality of second electrodes,
wherein the plurality of first electrodes are spaced apart from the plurality of second electrodes and any one of the plurality of second electrodes at least partially overlaps any one of the plurality of first electrodes, and
wherein at least one of the plurality of protrusions overlaps a region where one of the plurality of first electrodes and one of the plurality of second electrodes overlap each other.

2. The display device of claim 1, wherein each of the plurality of protrusions has an area less than or substantially equal to that of the region where the one of the plurality of first electrodes and the one of the plurality of second electrodes overlap each other.

3. A display device, comprising:
a frame that includes a plurality of protrusions;
a display panel disposed on the frame and that includes a planar portion and a curved portion disposed along at least one end of the planar portion;
a pressure sensing unit disposed between the frame and the display panel that overlaps the curved portion and that includes a plurality of first electrodes and a plurality of second electrodes; and
a pressure sensing drive unit connected to the plurality of first electrodes and the plurality of second electrodes,
wherein any one of the plurality of second electrodes at least partially overlaps any one of the plurality of first electrodes,
wherein at least one of the plurality of protrusions overlaps a region where one of the plurality of first electrodes and one of the plurality of second electrodes overlap each other; and
wherein a top surface of each of the plurality of protrusions has a curvature radius less than or substantially equal to that of the pressure sensing unit.

4. A display device, comprising:
a frame that includes a plurality of protrusions;
a display panel disposed on the frame and that includes a planar portion and a curved portion disposed along at least one end of the planar portion;
a pressure sensing unit disposed between the frame and the display panel that overlaps the curved portion and that includes a plurality of first electrodes and a plurality of second electrodes; and
a pressure sensing drive unit connected to the plurality of first electrodes and the plurality of second electrodes,
wherein any one of the plurality of second electrodes at least partially overlaps any one of the plurality of first electrodes,
wherein at least one of the plurality of protrusions overlaps a region where one of the plurality of first electrodes and one of the plurality of second electrodes overlap each other,
wherein the frame includes a base, a support disposed on the base, and a spacer that protrudes from the support at one end of the support; and
wherein the plurality of protrusions protrude from the support and have a height less than a height of the spacer.

5. The display device of claim 4, wherein a top surface of the support has a curvature substantially identical to that of the curved portion of the display panel.

6. The display device of claim 1, wherein the plurality of first electrodes extend in a first direction, and the plurality of second electrodes extend in a second direction that intersects the first direction.

7. A display device, comprising:
a frame that includes a plurality of protrusions;
a display panel disposed on the frame and that includes a planar portion and a curved portion disposed along at least one end of the planar portion;
a pressure sensing unit disposed between the frame and the display panel that overlaps the curved portion and that includes a plurality of first electrodes and a plurality of second electrodes; and
a pressure sensing drive unit connected to the plurality of first electrodes and the plurality of second electrodes,
wherein any one of the plurality of second electrodes at least partially overlaps any one of the plurality of first electrodes,
wherein at least one of the plurality of protrusions overlaps a region where one of the plurality of first electrodes and one of the plurality of second electrodes overlap each other,
wherein the plurality of first electrodes extend in a first direction, and the plurality of second electrodes extend in a second direction that intersects the first direction, and
wherein each of the plurality of protrusions extends in the first direction, and has a width less than or substantially equal to a width of any one of the plurality of first electrodes.

8. A display device, comprising:
a frame that includes a plurality of protrusions;
a display panel disposed on the frame and that includes a planar portion and a curved portion disposed along at least one end of the planar portion;
a pressure sensing unit disposed between the frame and the display panel that overlaps the curved portion and that includes a plurality of first electrodes and a plurality of second electrodes; and
a pressure sensing drive unit connected to the plurality of first electrodes and the plurality of second electrodes,
wherein any one of the plurality of second electrodes at least partially overlaps any one of the plurality of first electrodes,
wherein at least one of the plurality of protrusions overlaps a region where one of the plurality of first electrodes and one of the plurality of second electrodes overlap each other,
wherein, the plurality of first electrodes extend in a first direction, and the plurality of second electrodes extend in a second direction that intersects the first direction, and
wherein each of the plurality of protrusions extends in a second direction, and has a width less than or substantially equal to a width of any one of the plurality of second electrodes.

9. A display device, comprising:
a frame that includes a plurality of protrusions;
a display panel disposed on the frame and that includes a planar portion and a curved portion disposed along at least one end of the planar portion;
a pressure sensing unit disposed between the frame and the display panel that overlaps the curved portion and that includes a plurality of first electrodes and a plurality of second electrodes; and
a pressure sensing drive unit connected to the plurality of first electrodes and the plurality of second electrodes; and
a plurality of variable resistor members, each of the variable resistor members being disposed between one of the plurality of first electrodes and one of the plurality of second electrodes,
wherein any one of the plurality of second electrodes at least partially overlaps any one of the plurality of first electrodes, and
wherein at least one of the plurality of protrusions overlaps a region where one of the plurality of first electrodes and one of the plurality of second electrodes overlap each other.

10. The display device of claim 1, wherein the region where the one of the plurality of first electrodes and the one of the plurality of second electrodes overlap each other overlaps at least two of the plurality of protrusions.

11. The display device of claim 1, wherein each of the plurality of protrusions has one of a semicircular-sectional shape, a polygonal column shape, a cylindrical column shape, a polygonal pyramid shape, or a cone shape.

12. The display device of claim 1, wherein:
the display panel includes a plurality of pixels; and
the region where the one of the plurality of first electrodes and the one of the plurality of second electrodes overlap each other has an area greater than that of any one of the plurality of protrusions.

13. A display device comprising:
a frame that includes a base, a support disposed on the base, and a plurality of protrusions that protrude from the support;
a display panel disposed on the frame and that includes a planar portion and a curved portion disposed along at least one end of the planar portion; and
a pressure sensing unit disposed between the frame and the display panel and that includes a plurality of first electrodes and a plurality of second electrodes,
wherein the plurality of first electrodes do not contact with the plurality of second electrodes and any one of the plurality of second electrodes at least partially overlaps any one of the plurality of first electrodes, and
wherein at least one of the plurality of protrusions overlaps a region where one of the plurality of first electrodes and one of the plurality of second electrodes overlap each other.

14. The display device of claim 13, further comprising:
a pressure sensing drive unit connected to the plurality of first electrodes and the plurality of second electrodes.

15. The display device of claim 13, wherein a top surface of the support has a shape substantially identical to that of the display panel.

16. A display device, comprising:
a frame that includes a base, a support disposed on the base, and a plurality of protrusions that protrude from the support;
a display panel disposed on the frame and that includes a planar portion and a curved portion disposed along at least one end of the planar portion;
a pressure sensing unit disposed between the frame and the display panel and that includes a plurality of first electrodes and a plurality of second electrodes;
wherein any one of the plurality of second electrodes at least partially, overlaps any one of the plurality of first electrodes,
wherein at least one of the plurality of protrusions overlaps a region where one of the plurality of first electrodes and one of the plurality of second electrodes overlap each other, and
wherein the base comes into contact with at least one side surface of the display panel and the pressure sensing unit.

17. The display device of claim 13, wherein the support overlaps both the planar portion and the curved portion.

18. The display device of claim 13, further comprising a window disposed on the display panel.

19. The display device of claim 13, further comprising a touch sensing unit disposed between the window and the display panel.

20. A display device, comprising:
a frame that includes a plurality of protrusions;
a display panel disposed on the frame and that includes a planar portion and a curved portion disposed along at least one end of the planar portion;
a pressure sensing unit disposed between the frame and the display panel and that includes a plurality of first electrodes that extend in a first direction, a plurality of second electrodes that extend in a second direction that intersects the first direction, and a plurality of variable resistor members; and
a pressure sensing drive unit connected to the plurality of first electrodes and the plurality of second electrodes,
wherein the pressure sensing unit includes a plurality of unit pressure sensors, Wherein each of the plurality of unit pressure sensors is connected to one of the plurality of first electrodes, one of the plurality of second electrodes that overlaps the one of the plurality of first electrodes, and a variable resistor member disposed between the one of the plurality of first electrodes and the one of the plurality of second electrodes, and
wherein at least one of the plurality of protrusions overlaps one of the unit pressure sensors.

21. The display device of claim 20, wherein each of the plurality of protrusions has an area less than or substantially equal to an area of the unit pressure sensor.

22. The display device of claim 20, wherein the unit pressure sensor overlaps at least two of the plurality of protrusions.

23. The display device of claim 20, wherein the pressure sensing unit is curved and a top surface of each of the plurality of protrusions has a curvature radius less than or substantially equal to a curvature radius of the pressure sensing unit.

24. The display device of claim 1, wherein the plurality of first electrodes do not contact with the plurality of second electrodes.

25. The display device of claim 1, wherein the plurality of second electrodes is disposed in a different layer from the plurality of first electrodes.

* * * * *